(12) United States Patent
Lin

(10) Patent No.: US 12,483,116 B2
(45) Date of Patent: Nov. 25, 2025

(54) LOW-POWER FAST-TRANSIENT CURRENT-SINK BUFFER

(71) Applicant: Cypress Semiconductor Corporation, San Jose, CA (US)

(72) Inventor: Adrian Lin, Austin, TX (US)

(73) Assignee: Cypress Semiconductor Corporation, San Jose, CA (US)

( * ) Notice: Subject to any disclaimer, the term of this patent is extended or adjusted under 35 U.S.C. 154(b) by 259 days.

(21) Appl. No.: 18/307,517

(22) Filed: Apr. 26, 2023

(65) Prior Publication Data

US 2024/0364208 A1 Oct. 31, 2024

(51) Int. Cl.
*H02M 1/14* (2006.01)
*G05F 1/575* (2006.01)
*H02M 3/155* (2006.01)

(52) U.S. Cl.
CPC .......... *H02M 1/143* (2013.01); *H02M 3/155* (2013.01)

(58) Field of Classification Search
CPC ......... G05F 1/575; G05F 1/461; H02M 1/143
See application file for complete search history.

(56) References Cited

U.S. PATENT DOCUMENTS

| 8,981,745 B2* | 3/2015 | Price | G05F 1/56 |
| | | | 323/284 |
| 9,946,283 B1* | 4/2018 | Yung | G05F 1/575 |
| 11,480,985 B2* | 10/2022 | Zhong | G05F 1/575 |
| 2012/0007660 A1* | 1/2012 | Hummerston | G11C 5/147 |
| | | | 327/530 |
| 2017/0017250 A1* | 1/2017 | Peluso | G05F 1/575 |

* cited by examiner

*Primary Examiner* — Sisay G Tiku

(57) ABSTRACT

A current-sink buffer is provided including a differential amplifier having a closed first-loop to provide a buffered output voltage, and a closed second-loop to sink transients in a load current of an output to ground. The first-loop includes a first transistor with a gate coupled to a reference-voltage, and a source coupled to a current-source; a second transistor with a gate coupled to a drain and the output, and a source coupled to the source of the first transistor; a first current-sink through which a drain of the first transistor is coupled to ground; and a second current-sink through which the second transistor drain is coupled to ground. The second-loop includes a third transistor with a grounded source, a drain coupled to the second transistor drain, and a gate coupled to the first transistor drain, and a capacitor coupled between the gate and drain of the third transistor.

14 Claims, 9 Drawing Sheets

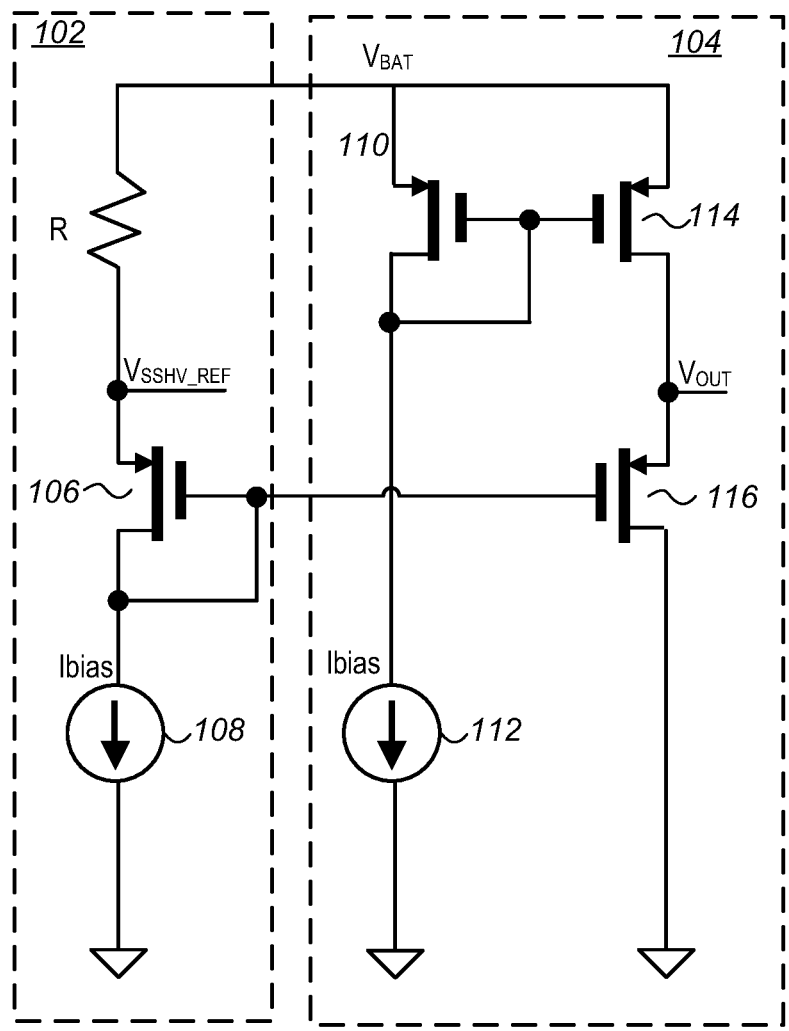
FIG. 1
(conventional)

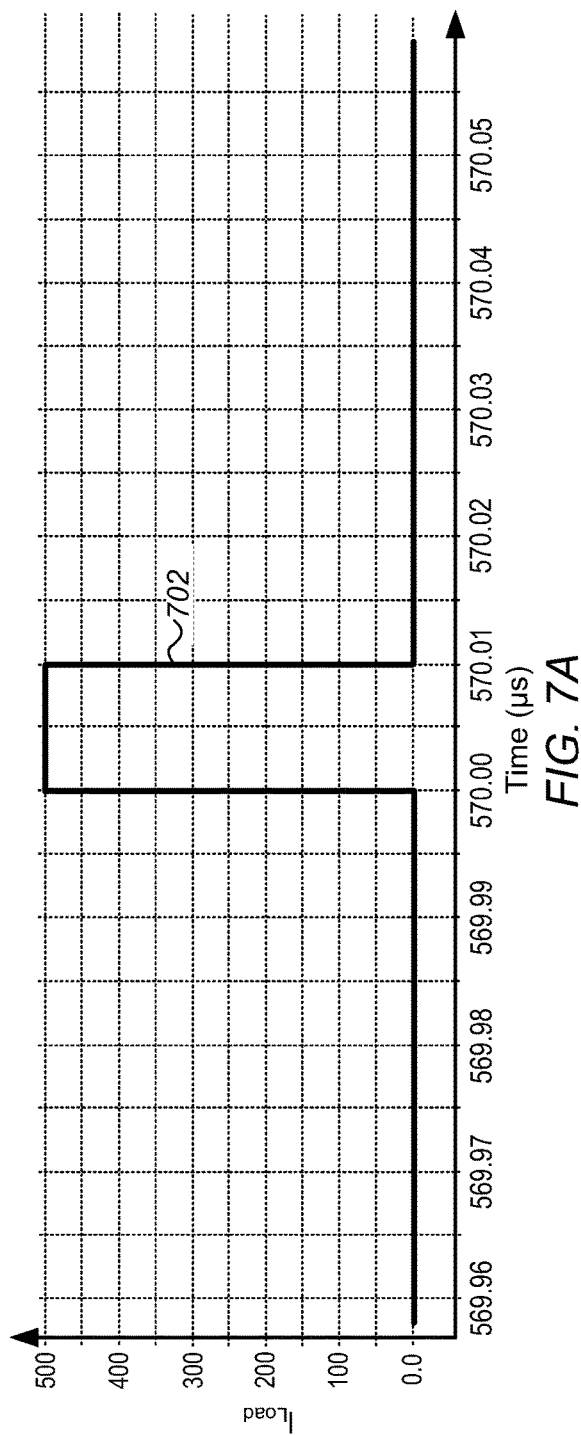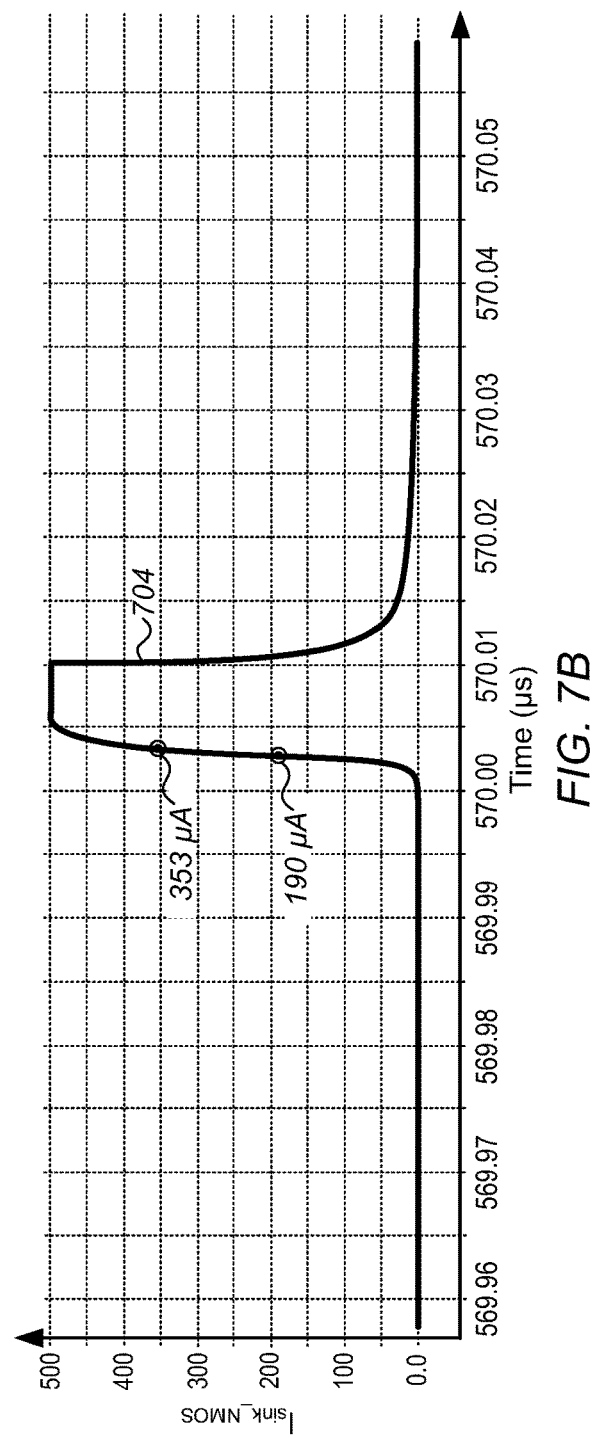
FIG. 7A
FIG. 7B

LOW-POWER FAST-TRANSIENT CURRENT-SINK BUFFER

TECHNICAL FIELD

This present disclosure relates generally to current-sink circuits, and more particularly to a low-power, fast-transient current-sink buffer for use in a switching power supply or voltage regulator.

BACKGROUND

Many electronic products, such as Bluetooth radios, automotive infotainment systems, and Wi-Fi hubs and receivers include microcontroller units (MCU) or programmable systems on a chip (PSoC), in which a processor unit, memory, and communication interfaces and peripherals are integrally formed as a single integrated circuit (IC) or die with a power management unit (PMU) or Switching Regulator (SR) designed to provide stable, noise free DC voltage to logic devices in the IC. Typically, the logic devices are fabricated using metal-oxide-semiconductor field-effect (MOS) transistors capable of operating with gate-to-source voltage of about 1.8 volts (V) across their gate oxides (Gox), i.e., 1.8V Gox devices. In the past the PMU or SR could be fabricated on the same IC using 2.5V Gox devices, which were required to allow continuous operation at battery or DC input voltages ranging from 1.6V to 4.8 V. However, as semiconductor fabrication technologies shrink the size of logic MOS devices to 28 nanometers (nm) or 22 nm and beyond, process limitations prevents the use of 2.5V Gox and 1.8V Gox devices in the same die, thus only 1.8V Gox devices are available to use for both the logic devices of the MCU and power transistors or devices of the PMU or SR. With only 1.8V Gox devices available for use, the PMU or SR must use a floating-rail architecture to limit the gate-to-source voltage across the power transistors or devices to 1.8 V. However, this 1.8V Gox limitation will limit a minimum battery or DC input voltage of state-of-the-art floating-rail architectures.

FIG. 1 is a schematic diagram of a conventional floating-rail reference generator 102 and a current-sink (I-sink) buffer 104 commonly used in or with conventional PMUs or SRs.

Referring to FIG. 1, the floating-rail reference generator 102 includes a diode connected p-type or p-channel MOS (PMOS) transistor 106 having a source coupled through a resistor (R) to a battery or DC input voltage ($V_{BAT}$), and a drain coupled through a current source 108 to a ground and to a gate of the transistor 106. A floating-rail reference voltage ($V_{SSHV\_REF}$) is taken from a node between the resistor (R) and transistor 106, and is generally equal to $V_{BAT} - I_{bias} \cdot R$. However, a drain source voltage (Vdsat) of the current source 108 and a diode voltage of the transistor 106, limit the minimum $V_{BAT}$ to 2.7 V in order to maintain the $V_{SSHV\_REF}$ at 1.8 V below $V_{BAT}$.

Further limitations arise in design and operation of current sink buffers used to limit current arising from fast-transient load currents. Referring again to FIG. 1, the I-sink buffer 104 has a PMOS voltage follower topology. Generally, the I-sink buffer 104 includes a pair of PMOS transistors functioning as a first current mirror, and having a diode connected first transistor 110 with a source coupled to $V_{BAT}$ and a drain coupled through a current source 112 to ground and to the gate of first transistor and to a gate of a second transistor 114 of the pair. The second transistor 114 has a source coupled to $V_{BAT}$, and a drain coupled to a source of a PMOS third transistor 116. The third transistor 116 has a drain coupled to ground, and a gate coupled to the gate and drain of the transistor 106 in the floating-rail reference generator 102 to form a second current mirror.

The currents ($I_{bias}$) through the first and second current sources 108, 112, are equal and under normal operating conditions, i.e., no transients in load current ($I_{LOAD}$) and $I_{bias}$ matches $I_{LOAD}$, the third transistor 116 functions as a PMOS voltage follower, such that an output voltage ($V_{OUT}$) taken from a node between the second and third transistors 114, 116, follows $V_{SSHV\_REF}$ ($V_{OUT} = V_{SSHV} = V_{BAT} - I_{bias} \cdot R$). However, the I-sink buffer 104 forms an unregulated, open-loop circuit so the above is true only under perfect matching conditions.

A further limitation of the I-sink buffer 104 of FIG. 1 is that to enable fast transient load current-sink requires high quiescent currents (Idq) of the load through the third transistor 116 and resulting in the need for high quiescent currents through the first and second current sources 108, 112, increasing the power consumed by the I-sink buffer, and reducing the efficiency of the floating rail circuit or PMU or SR in which it is embodied.

Accordingly, there is a need for a floating-rail reference generator capable of providing a stable $V_{SSHV\_REF}$ at battery voltages below 2.7V. There is a further need for I-sink buffer capable of rapidly sinking transients in a current load ($I_{LOAD}$) to provide a stable $V_{OUT}$ equal to $V_{SSHV\_REF}$ when $I_{LOAD}$ is not matched to the bias current ($I_{bias}$). It is further desirable that the I-sink buffer is a low power I-sink buffer, not requiring high quiescent $I_{bias}$ currents.

SUMMARY

A current-sink buffer and method are provided for sinking transients in a current of a load coupled to an output of the buffer to ground to deliver a stable, buffered output voltage to the load. The current-sink buffer includes a one-stage differential amplifier having a first closed-loop operable to provide to the output a buffered output voltage ($V_{OUT}$) that tracks a reference voltage ($V_{SSHV\_REF}$) received on an input of the buffer, and a second closed-loop operable to sink at least a portion of a load current ($I_{LOAD}$) in the load to ground during transients in the load current. The current-sink buffer further includes a first current source coupled to an input voltage ($V_{BAT}$) and operable to generate a biasing current ($I_{bias}$), and the one-stage differential amplifier is coupled to $V_{BAT}$ through the first current source.

Generally, the first closed-loop includes first and second transistors, and first and second current sinks. The first transistor includes a gate coupled to the input, and a source coupled to the first current source. The second transistor matched to the first transistor, and is diode connected with a gate coupled to a drain and to the output, and a source coupled to the first current source and to the source of the first transistor. A drain of the first transistor is coupled to ground through the first current sink, and the drain of the second transistor is coupled to ground through the second current sink.

In some embodiments, the first current sink includes second current source through which a drain of the first transistor is coupled to ground, the second current source generating a current ($0.5 \cdot I_{bias}$) half that of the first current source. The first current sink enables the third transistor to provide a $V_{OUT}$ equal to $V_{SSHV\_REF}$, for $V_{SSHV\_REF}$ from 0 V to VBAT—VGS—Vdsat where VGS is a gate-source voltage of the first transistor and Vdsat is the drain to source voltage of the first current source.

The second current sink includes a third transistor with a channel-type different from the first and second transistors, having a source coupled to ground, a drain coupled to the drain of the second transistor, and a gate coupled to the drain of the first transistor, and a capacitor coupled between the gate and drain of the third transistor. The second current sink has a bandwidth that is independent of the current ($I_{bias}$) of the first current source, enabling $I_{bias}$ to be maintained at a predetermined minimum current less than or equal to 25 nano-amperes (nA), independent of $V_{BAT}$ and $I_{LOAD}$.

The second closed-loop includes the third transistor and the capacitor coupled between the gate and drain of the third transistor. During transients in the load current, the capacitor transforms the third transistor into diode connected transistor, sinking the transient in ILOAD to ground.

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

FIG. 1 is a schematic diagram of a conventional floating-rail reference generator and a current-sink (I-sink) buffer commonly used in or with conventional power management units (PMU) or switching regulators (SR);

FIGS. 7A and 7B are graphs illustrating, respectively, a single spike in load current ($I_{load}$) and the resultant sinking current ($I_{sink\_NMOS}$) from the graphs of FIG. 6;

DETAILED DESCRIPTION

A low-power, fast-transient current-sink (I-sink) buffer and method for buffering and sinking transient currents of a floating-rail voltage are provided. The I-sink buffer and methods of the present disclosure are particularly useful in portable and low-power applications such as in a power management unit (PMU) or switching regulator (SR) for Bluetooth (BT) radios, Wi-Fi hubs or receivers, and other microcontroller units (MCU).

In the following description, for purposes of explanation, numerous specific details are set forth in order to provide a thorough understanding of the present invention. It will be evident, however, to one skilled in the art that the present invention can be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term to 'couple' as used herein can include both to directly electrically connect two or more components or elements and to indirectly connect through one or more intervening components.

Figure 2:
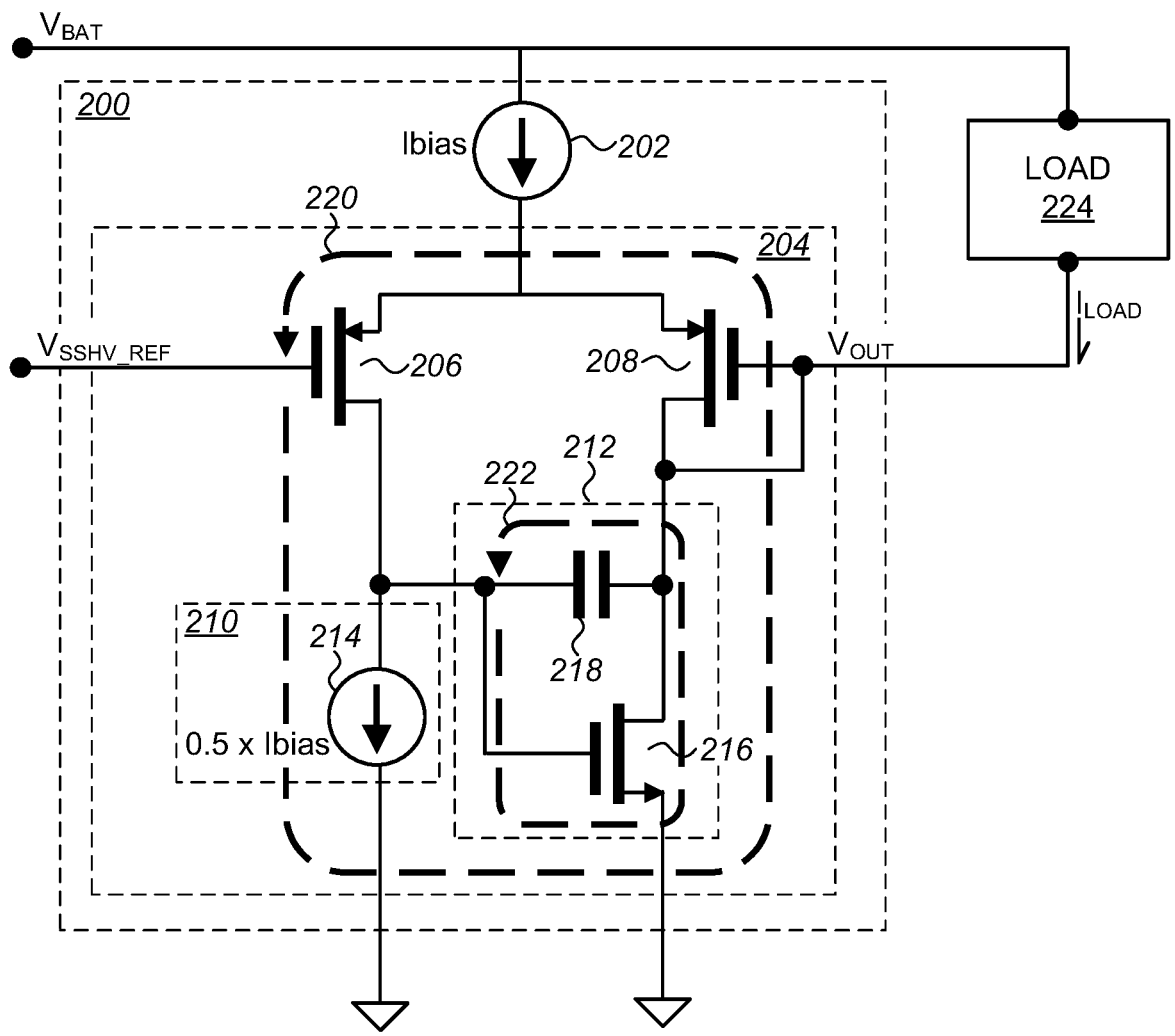
FIG. 2 is a schematic diagram of a low-power, fast-transient current-sink (I-sink) buffer according to an embodiment of the present disclosure.

An embodiment of a current-sink (I-sink) buffer 200 will now be described with reference to FIG. 2. FIG. 2 is a schematic block diagram of an embodiment of a current-sink (I-sink) buffer 200. Referring to FIG. 2, the I-sink buffer 200 generally includes a first current source 202 coupled to a DC input voltage ($V_{BAT}$) and operable to generate a biasing current ($I_{bias}$), and a one-stage, differential amplifier 204 coupled between the first current source and ground. The differential amplifier 204 includes a first transistor 206 having a gate coupled to a buffer input to receive floating-rail reference voltage ($V_{SSHV\_REF}$), and a source coupled to the first current source 202, and a second transistor 208 matched to the first transistor, having a source coupled to the first current source and to the source of the first transistor. The second transistor 208 is diode connected with a gate coupled to a drain and to a buffer output to output a buffered output voltage ($V_{OUT}$). In the embodiment shown, the first and second transistor 206, 208, include p-type or p-channel MOS (PMOS) transistors.

The differential amplifier 204 further includes a first current sink 210 through which a drain of the first transistor 206 is coupled to ground, and a second current sink 212 through which the drain of the second transistor 208 is coupled to ground. The first current sink includes a second current source 214 through which a drain of the first transistor 206 is coupled to ground. The second current sink 212 includes a third transistor 216 having a source coupled to ground, a drain coupled to the drain of the second transistor 208, and a gate coupled to the drain of the first transistor 206, and through a capacitor coupled between the gate and drain of the third transistor to the drains of both the second and third transistors 208, 216. The third transistor 216 has a channel-type different from the first and second transistors 206, 208, and in the embodiment shown is a NMOS transistor.

The first and second transistors 206, 208, and first and second current sinks 210, 212, of the 204 form a first KVL loop or first closed-loop 220. The first closed-loop 220 is operable to provide to a $V_{OUT}$ that tracks the $V_{SSHV\_REF}$ received on the input. The use of a second current source 214 generating a current half that of the first current source 202 or 0.5·Ibias, instead of a diode-connected transistor 106 as shown in FIG. 1, enables the third transistor 216 in the first closed-loop 220 to provide a $V_{OUT}$ equal to $V_{SSHV\_REF}$, for $V_{SSHV\_REF}$ from 0 V to $V_{BAT}-V_{GS}$, where $V_{GS}$ is a gate-source voltage of the first transistor 206.

The I-sink buffer 200 further includes a smaller, second closed-loop 222 also formed in the differential amplifier 204 by the third transistor 216 and capacitor 218 or the second current sink 212, which is operable to sink at least a portion of a load current ($I_{LOAD}$) of a load 224 coupled between the output and $V_{BAT}$ to ground during spikes or transients in $I_{LOAD}$. During transients in the load current, the capacitor transforms the third transistor 216 into diode connected transistor, sinking the transient in $I_{LOAD}$ to ground. It is further noted that a bandwidth of the second closed-loop 222 is independent of the current ($I_{bias}$) of the first current source 202, enabling $I_{bias}$ to be maintained at a predetermined minimum current less than or equal to 25 nano-amperes (nA), independent of $V_{BAT}$ and $I_{LOAD}$. The load 224 charges the capacitor 218, which subsequently pulls up the gate of transistor 216 to immediately sink the load to ground. Thus, the I-sink buffer 200 harvests the current from the load 224 itself to perform the sinking instead of relying on Ibias alone as in the conventional buffer circuits, and Ibias is constant during both quiescent operation and load sinking.

Figure 3:
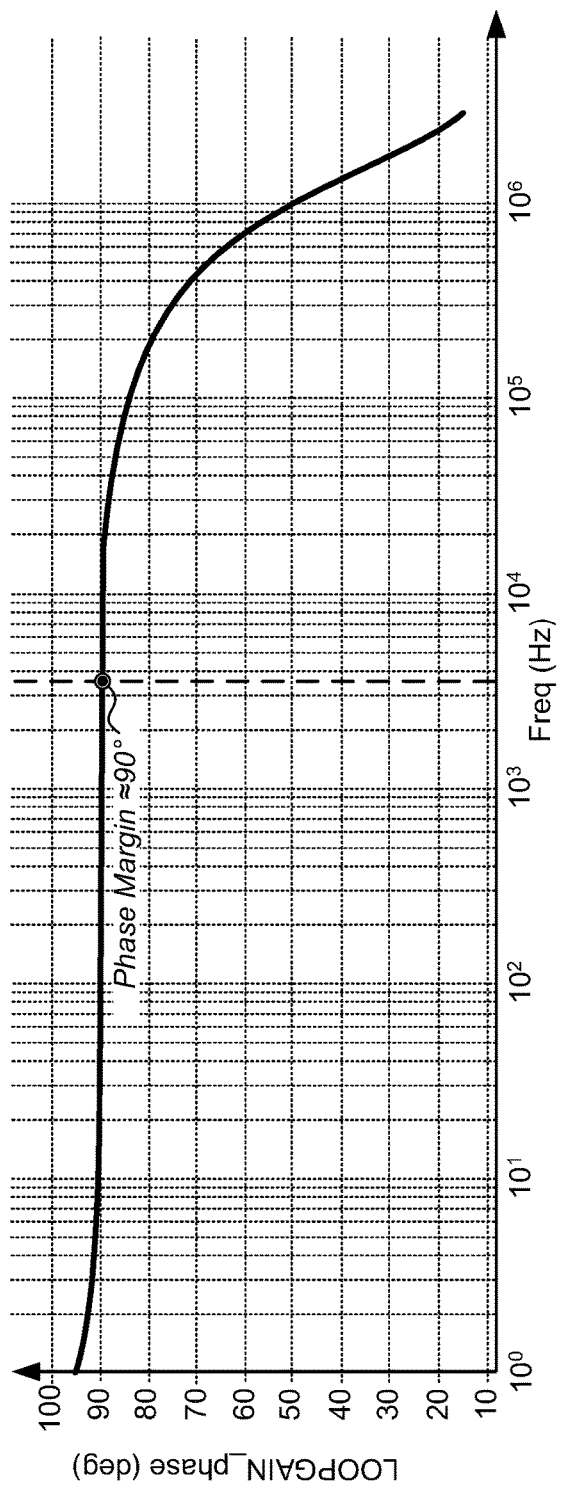
FIG. 3 includes graphs showing gain (LOOPGAIN) and phase margin (LOOPGAIN_phase) versus frequency (Freq.) for the I-sink buffer of FIG. 2, and illustrating the stability and bandwidth of the circuit.
Figure 3:
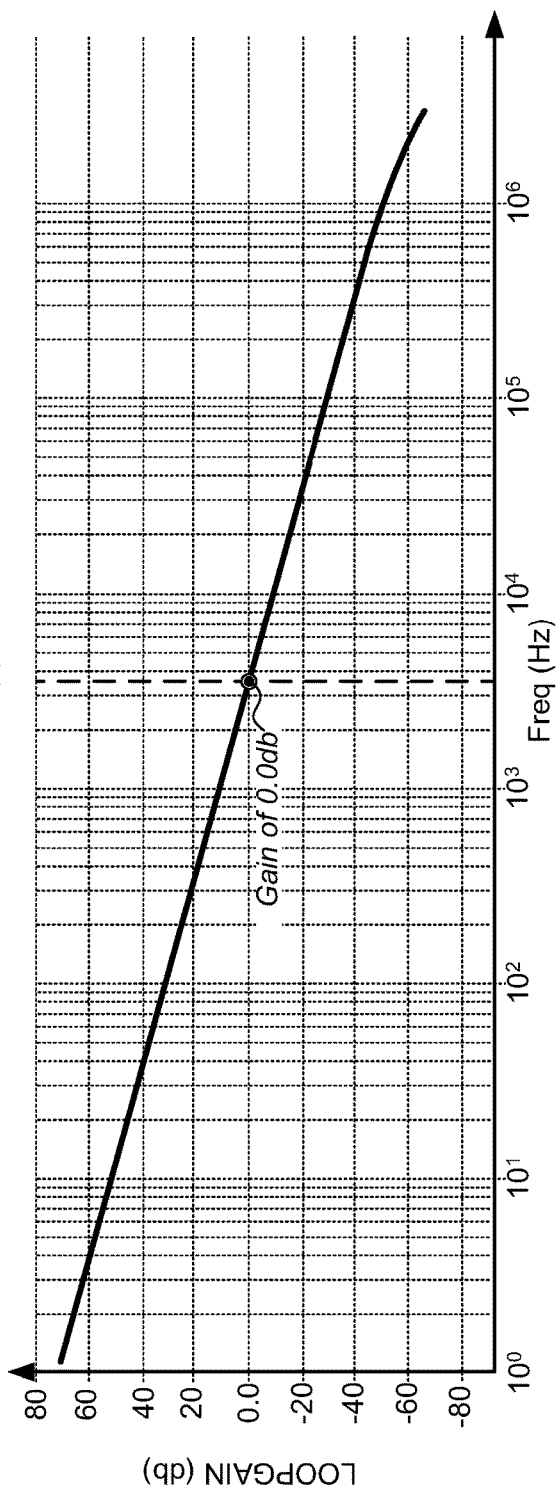

FIG. 3 includes graphs showing gain (LOOPGAIN) and phase margin (LOOPGAIN_phase) versus frequency (Freq.) for the I-sink buffer of FIG. 2 illustrating the stability and bandwidth of the circuit. Referring to the lower graph of FIG. 3 it is seen that the I-sink Buffer 200 has a unity gain of 0.0 db at a frequency of about 3.6 kHz. Referring to the upper graph 3 it is seen that at the same frequency the I-sink Buffer 200 has a phase margin of about 90°.

Figure 4:
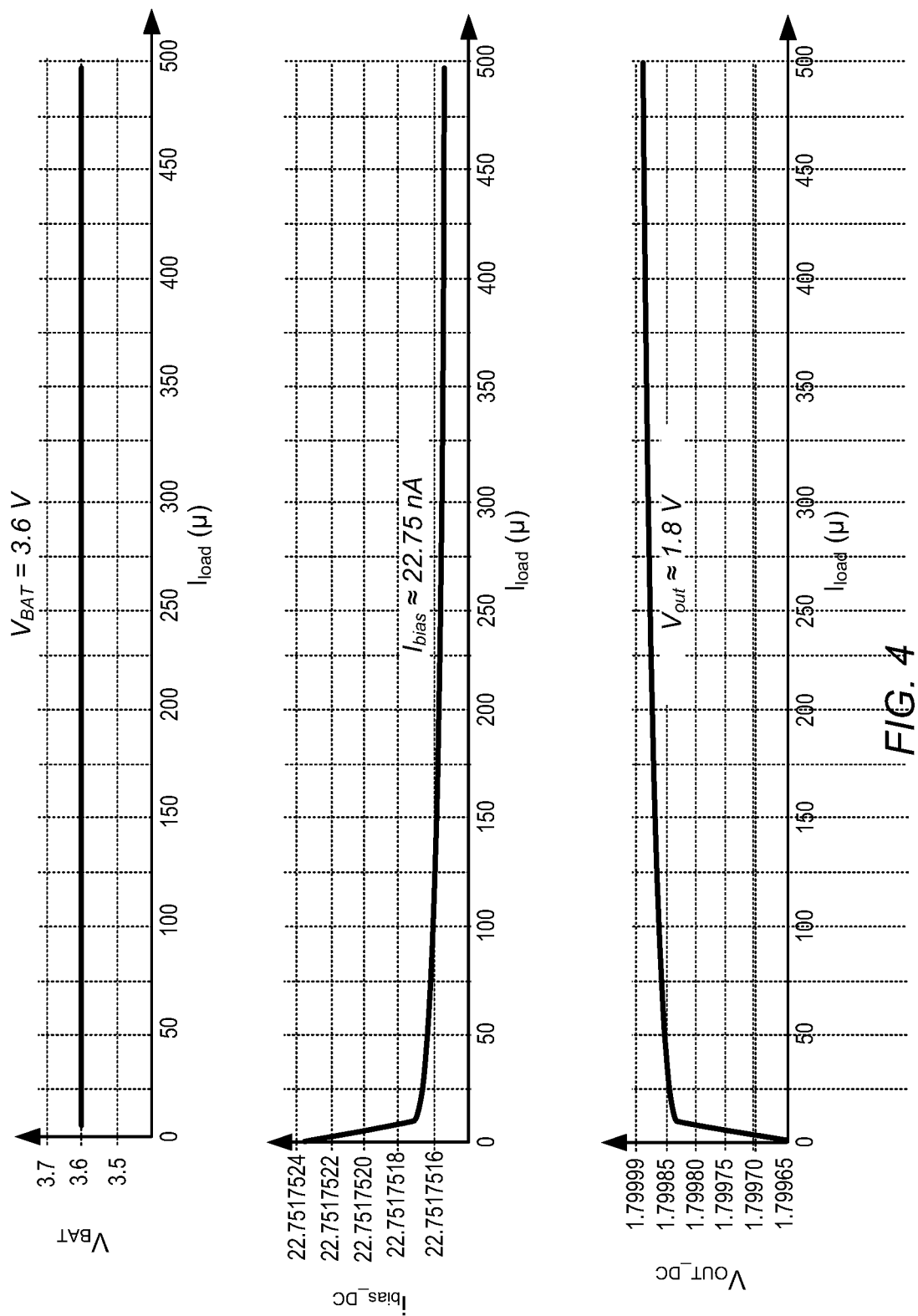
FIG. 4 includes graphs of a battery voltage ($V_{BAT}$), bias current ($I_{bias\_DC}$) and output voltage ($V_{OUT\_DC}$) versus load current ($I_{load}$) for the I-sink buffer of FIG. 2 with a battery voltage of 3.6 V.

FIG. 4 includes graphs of bias current and output voltage versus load current for the I-sink buffer of FIG. 2 illustrating the ability of the circuit to provide a well-regulated output voltage with a consistently low bias current and of the circuit with a battery voltage of 3.6 V. Referring to FIG. 4, it is seen that for a $V_{BAT}$=3.6 V (top graph), the bias current ($I_{bias\_DC}$) remains consistently low at a current of about 22.75 nA (middle graph), with a well-regulated output voltage ($V_{OUT\_DC}$) of about 1.8 V as the load current ($I_{load}$), shown on the horizontal axis, increases from 0 to 500 microamperes (µA).

Figure 5:
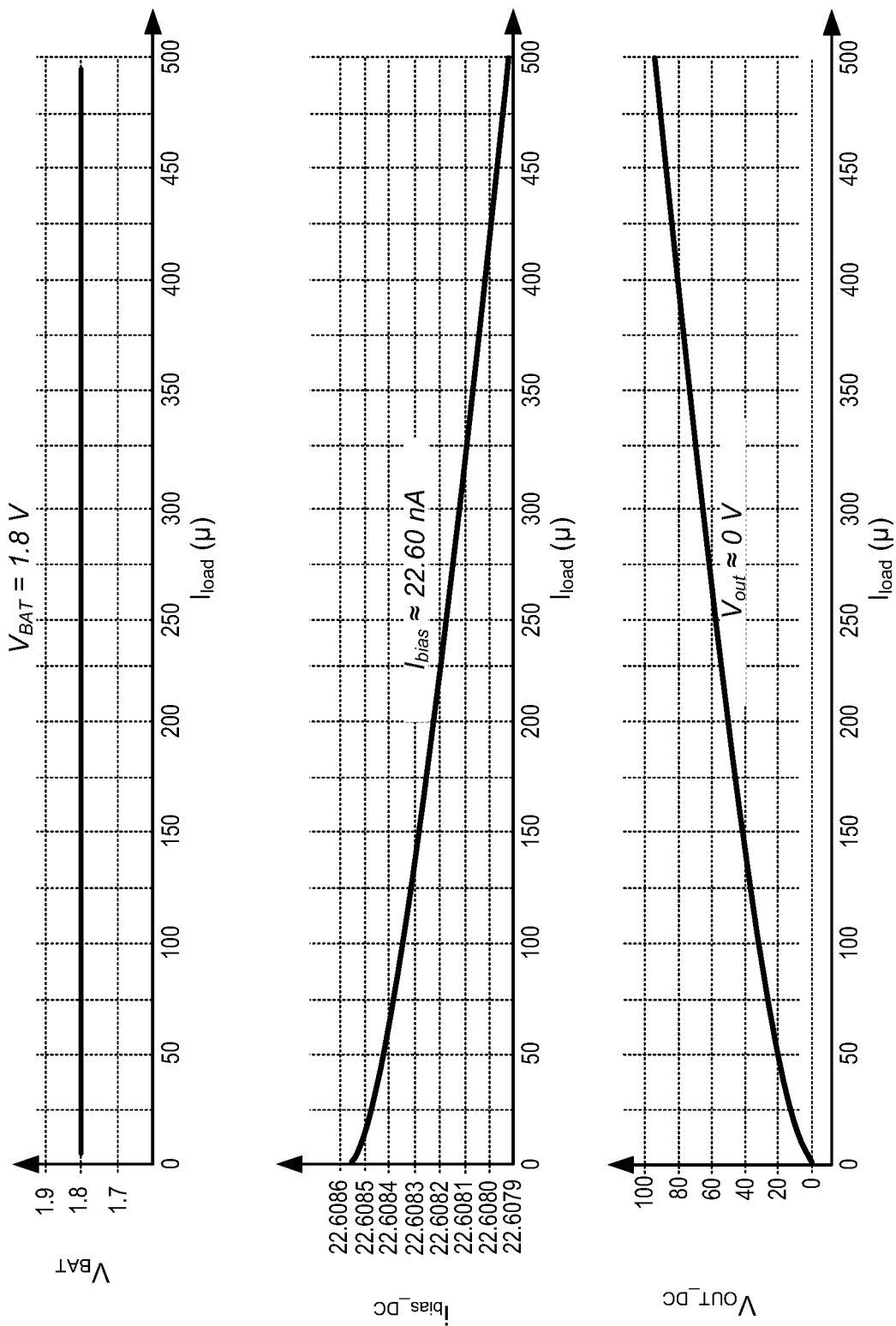
FIG. 5 includes graphs of a battery voltage ($V_{BAT}$), bias current ($I_{bias\_DC}$) and output voltage ($V_{OUT\_DC}$) versus load current ($I_{load}$) for the I-sink buffer of FIG. 2 with a battery voltage of 1.8 V.

FIG. 5 includes similar graphs of bias current ($I_{bias\_DC}$) and output voltage ($V_{OUT\_DC}$) versus load current ($I_{load}$) illustrating the ability of the I-sink buffer of FIG. 2 to provide a well-regulated output voltage with a consistently low bias current and of the circuit with a battery voltage of 1.8 V. Referring to FIG. 5, it is seen that for a $V_{BAT}$=1.8 V (top graph), the bias current ($I_{bias\_DC}$) remains consistently low at a current of about 22.66 nA (middle graph), with a well-regulated output voltage ($V_{OUT\_DC}$) of about 0 V as the load current ($I_{load}$), shown on the horizontal axis, increases from 0 to 500 microamperes (µA).

Figure 6:
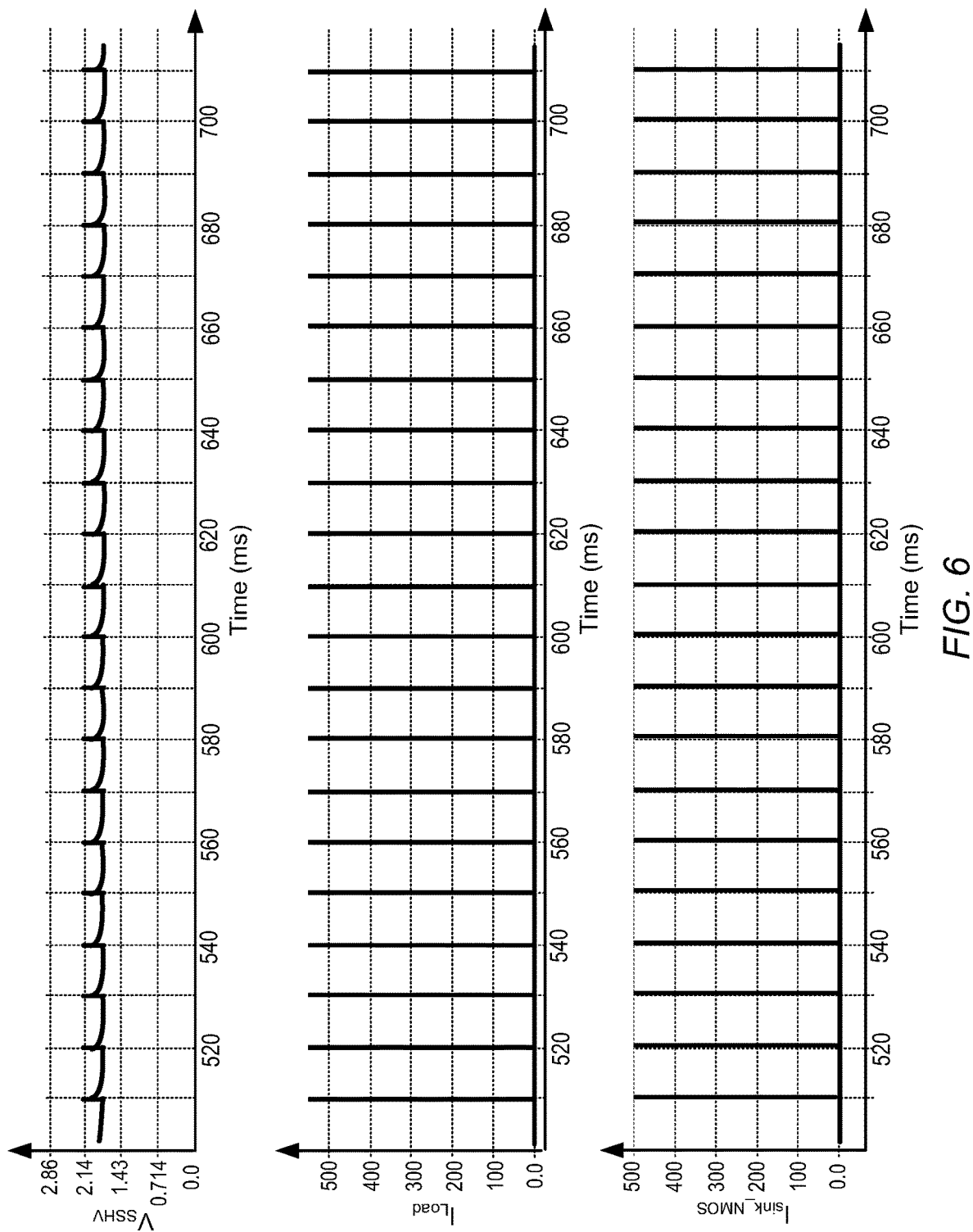
FIG. 6 includes graphs shows a floating-rail voltage ($V_{SSHV}$) output from the I-sink buffer of FIG. 2 and a sinking current ($I_{sink\_NMOS}$) versus time in response to a number of fast-transients or spikes in load current ($I_{load}$) and illustrating the ability of the circuit to sink transient currents in $I_{load}$.

FIG. 6 includes graphs shows a floating-rail voltage ($V_{SSHV}$) output from the I-sink buffer of FIG. 2 and a sinking current ($I_{sink\_NMOS}$) versus time in response to a number of fast-transient spikes or pulses in load current ($I_{load}$) and illustrating the ability of the circuit to sink transient currents in $I_{load}$. In particular, the middle graph shows the pulses in $I_{load}$, the lower graph shows the corresponding spikes or pulses in sinking current ($I_{sink\_NMOS}$), and the top graph illustrates the resultant low, brief increase in floating-rail voltage ($V_{SSHV}$), less than about 0.2 V.

FIGS. 7A and 7B are graphs illustrating, respectively, a single pulse in load current ($I_{load}$) and the resultant sinking current ($I_{sink\_NMOS}$) from the graphs of FIG. 6 in greater detail. Referring to FIG. 7A it is seen the pulse in load current ($I_{load}$ 702) begins at 570 microseconds (µs), has a duration of about a 10 nanosecond (ns) and a rise in load current ($I_{load}$) from 0 to 500 µA with rise and file times of less than about 1 picosecond (ps), or about 500 amperes per microsecond (A/µs). Referring to FIG. 7B it is seen the pulse the corresponding pulse or increase in sinking current ($I_{sink\_NMOS}$ 704) begins shortly after the pulse in load current ($I_{load}$ 702) and has a sinking current of about 190 µA after about time 570.0025 µs, and a sinking current 353 µA about time 570.0035 µs, for a rise time of about 10 ps, or about 274 amperes per microsecond (A/µs). The sinking current settles at a steady current substantially equal to the pulse in load current ($I_{load}$ 702) of about 500 µA after which it begins to quickly fall back to a sinking current of about 0.0 µA beginning at time 570.01 µs.

Figure 8:
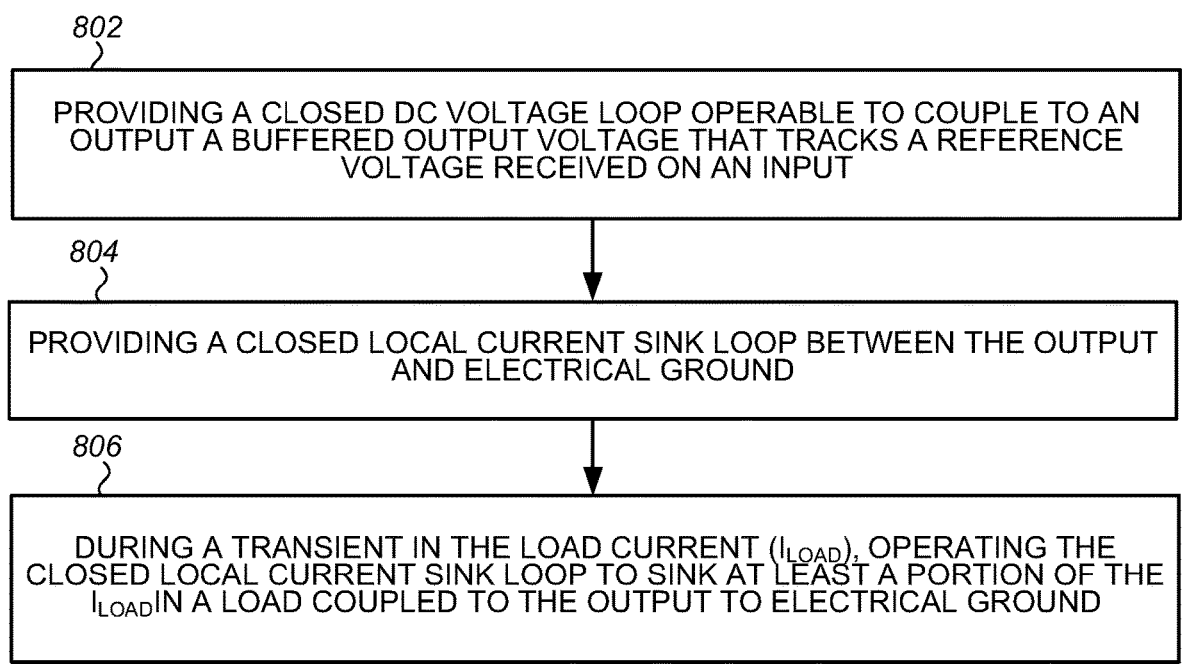
FIG. 8 is a flowchart illustrating a method for operating a low-power, fast-transient I-sink buffer of the present disclosure.

FIG. 8 is a flowchart illustrating a method for operating a low-power, fast-transient I-sink buffer to sink transients in a load current. Referring to FIG. 8, the method generally includes providing a closed DC voltage loop operable to couple to an output a buffered output voltage ($V_{OUT}$) that tracks a reference voltage ($V_{SSHV\_REF}$) received on an input (802); providing a closed local current sink loop between the output and ground (804); and during a transient in the load current ($I_{LOAD}$), operating the closed local current sink loop to sink at least a portion of the $I_{LOAD}$ in a load coupled to the output to ground (806).

Generally, as described above with respect to FIG. 2, providing the closed DC voltage loop (step 802) is accomplished by providing a first transistor with a gate coupled to the input, and a source coupled to an input voltage ($V_{BAT}$) through a first current source; providing a second transistor matched to the first transistor, where the second transistor is diode connected with a gate coupled to a drain and to the output, and a source coupled to the first current source and to the source of the first transistor; providing a first current sink through which a drain of the first transistor is coupled to ground; and providing a second current sink through which the drain of the second transistor is coupled to ground.

Providing the closed local current sink loop (step 804) is accomplished by providing a second current sink including a third transistor with a channel-type different from the first and second transistors, the third transistor having a source coupled to ground, a drain coupled to the drain of the second transistor, and a gate coupled to the drain of the first transistor, and a capacitor coupled between the gate and drain of the third transistor.

Figure 9:
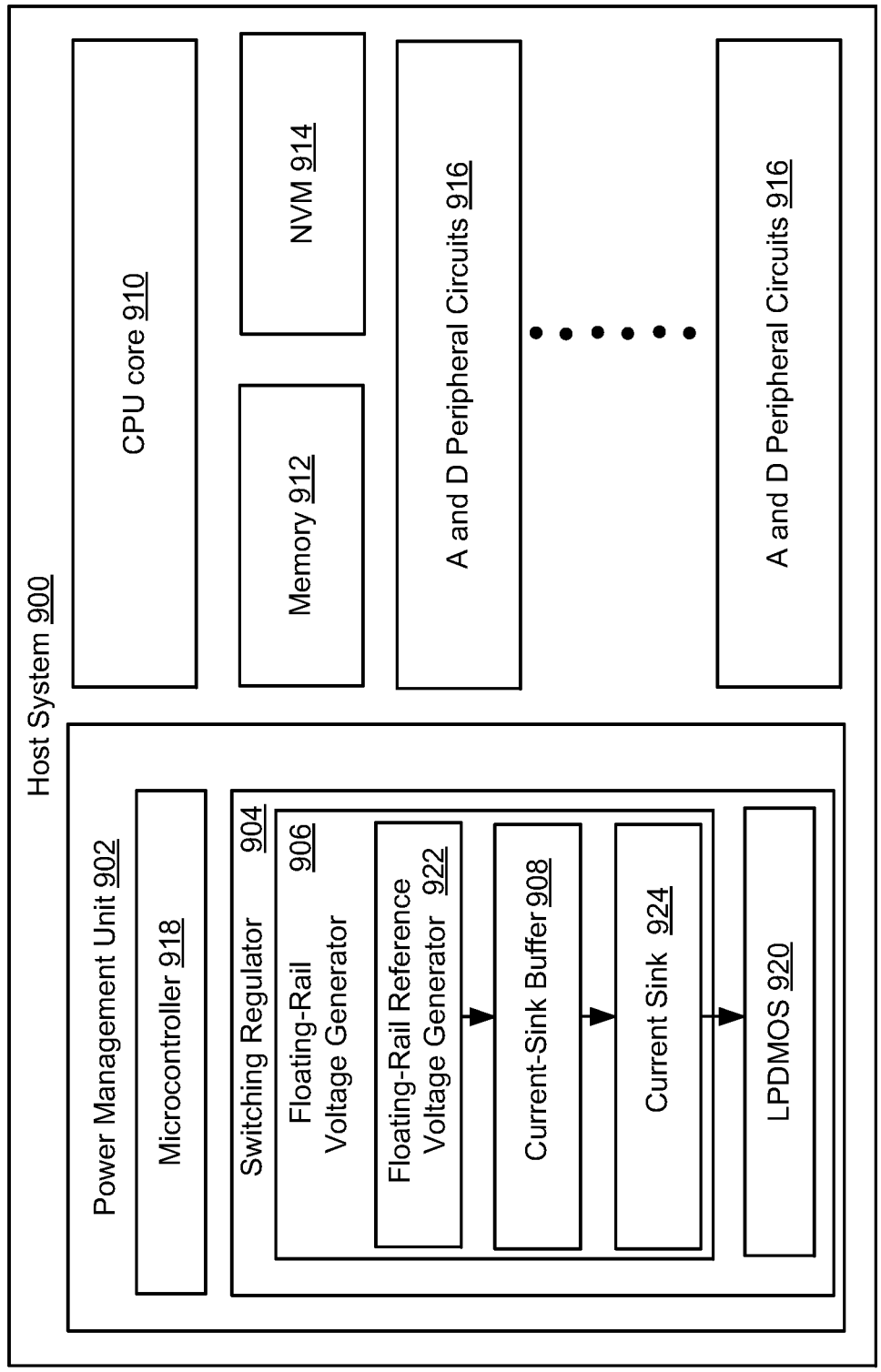
FIG. 9 is block diagram of a host system having a power management unit (PMU) with a switching regulator (SR) for which the I-sink buffer of the present disclosure is particularly useful.

FIG. 9 is block diagram of a host system 900 having a power management unit (PMU 902) with a switching regulator (SR 904) for which a floating-rail voltage generator 906 including a current-sink buffer 908 of the present disclosure is particularly useful.

Referring to FIG. 9, the host system 900 is generally a microcontroller unit (MCU) or programmable systems on a chip (PSoC) and can include a CPU core 910, volatile memory 912 and non-volatile memory (NVM 914), and a number of configurable integrated analog and digital peripheral circuits 916. Such MCUs are widely used in many automotive, and portable or non-portable electronic applications. Exemplary applications can include Bluetooth radios, and Wi-Fi hubs or receivers. The PMU 902 can include, in addition to the SR 904, a microcontroller 918 that controls the SR 904 and governs power functions of host system 900.

The SR 904 is operable to convert a voltage from a battery or other DC power source into output voltages required by other subsystems or devices in the host system 900. The SR 904 generally includes a high-side switch transistor, such as a laterally-diffused PMOS (LDPMOS) transistor 920, controlled by or receiving a floating-rail voltage ($V_{SSHV}$) from the floating-rail voltage generator 906 to supply the required output voltages. In addition to the floating-rail reference generator 906 of the present disclosure, the floating-rail voltage generator 906 can further include a floating-rail reference voltage generator 922 to generate a floating-rail reference voltage ($V_{SSHV\_REF}$) from which the $V_{SSHV}$ is generated, and a current sink 924 to sink transients in a load current, which can undesirably impact $V_{SSHV}$. Using the floating-rail reference voltage generator 922 to generate $V_{SSHV}$ and operate the SR 904 ensures that logic transistors and other devices in the host system 900 are not exposed to voltages across their gate oxides exceeding the maximum 1.8V limit required for 28 nm and 22 nm technologies and beyond.

Thus, floating-rail reference generators and methods of operating the same have been disclosed. Embodiments of the present invention have been described above with the aid of functional and schematic block diagrams illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention.

It is to be understood that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The breadth and scope of the present invention should not be limited by any of the above-described exemplary embodiments, but should be defined only in accordance with the following claims and their equivalents.

What is claimed is:

1. A current-sink buffer comprising:
a first current source coupled to an input voltage (VBAT) and operable to generate a biasing current ($I_{bias}$);
a first transistor with a gate operable to receive a floating-rail reference voltage ($V_{SSHV\_REF}$) and a source coupled to $V_{BAT}$ through the first current source;
a second transistor matched to the first transistor, wherein the second transistor is diode connected having a gate coupled to a drain, and a source coupled to the first current source and to the source of the first transistor;
a first current sink through which a drain of the first transistor is coupled to a ground; and
a second current sink through which the drain of the second transistor is coupled to the ground,
wherein an output voltage ($V_{OUT}$) from an output between the drain of the second transistor and the second current sink follows $V_{SSHV\_REF}$ is coupled to the gate of the second transistor and a load coupled to the output, and
wherein the second current sink comprises:
a third transistor with a channel-type different from the first and second transistors, the third transistor having a source coupled to the ground, a drain coupled to the drain of the second transistor through the output, and a gate coupled to the drain of the first transistor; and
a capacitor coupled between the gate and drain of the third transistor.

2. The current-sink buffer of claim 1, wherein during a transient in a load current ($I_{LOAD}$) of the load coupled to the output, the capacitor transforms the third transistor into a diode connected transistor, sinking the transient in $I_{LOAD}$ to the ground.

3. The current-sink buffer of claim 2, wherein a bandwidth of the second current sink is independent of the $I_{bias}$ of the first current source, enabling $I_{bias}$ to be maintained at a predetermined minimum current.

4. The current-sink buffer of claim 3, wherein the current-sink buffer is operable with the $I_{bias}$, independent of the $V_{BAT}$ and the $I_{LOAD}$.

5. The current-sink buffer of claim 1, wherein the first current sink comprises second current source through which the drain of the first transistor is coupled to the ground, the second current source generating a current ($0.5 \cdot I_{bias}$) half that of the first current source.

6. The current-sink buffer of claim 5, wherein the first current sink enables the third transistor to provide gain to regulate $V_{OUT}$ equal to $V_{SSHV\_REF}$, for $V_{SSHV\_REF}$ from 0 V to $V_{BAT}$-$V_{GS}$-Vdsat where $V_{GS}$ is a gate-source voltage of the first transistor and Vdsat is the drain to source voltage of the first current source.

7. The current-sink buffer of claim 6, wherein Vs is less than or equal to 1.8V.

8. The current-sink buffer of claim 5, wherein the current-sink buffer is operable to enable continuous operation with input voltages from 1.6 V to 4.8 V.

9. A current-sink buffer comprising:
a one-stage differential amplifier including a first closed-loop operable to provide to an output a buffered output voltage ($V_{OUT}$) that tracks a reference voltage ($V_{SSHV\_REF}$) received on an input, and a second closed-loop operable to sink at least a portion of a load current ($I_{LOAD}$) in a load coupled to the output to a ground during transients in the load current; and
a first current source coupled to an input voltage ($V_{BAT}$) and operable to generate a biasing current ($I_{bias}$), and wherein the one-stage differential amplifier is coupled to the VBAT through the first current source,
wherein the first closed-loop comprises:
a first transistor with a gate coupled to the input, and a source coupled to the first current source,
a second transistor matched to the first transistor, where the second transistor is diode connected with a gate coupled to a drain and to the output, and a source coupled to the first current source and to the source of the first transistor,
a first current sink through which a drain of the first transistor is coupled to ground, and a second current sink through which the drain of the second transistor is coupled to ground, and
wherein the second current sink comprises:
a third transistor with a channel-type different from the first and second transistors, the third transistor having a source coupled to the ground, a drain coupled to the drain of the second transistor, and a gate coupled to the drain of the first transistor; and
a capacitor coupled between the gate and drain of the third transistor.

10. The current-sink buffer of claim 9 wherein the second closed-loop comprises the third transistor and the capacitor coupled between the gate and drain of the third transistor.

11. The current-sink buffer of claim 10, wherein during transients in the load current, the capacitor transforms the third transistor into diode connected transistor, sinking the transient in $I_{LOAD}$ to the ground.

12. The current-sink buffer of claim 10, wherein a bandwidth of the second current sink is independent of the $I_{bias}$ of the first current source, enabling the $I_{bias}$ to be maintained at a predetermined minimum current, independent of $V_{BAT}$ and $I_{LOAD}$.

13. The current-sink buffer of claim 9, wherein the first current sink comprises second current source through which a drain of the first transistor is coupled to the ground, the second current source generating a current (0.5-Ibias) half that of the first current source, and wherein the first current sink enables the third transistor to provide a VOUT equal to VSSHV_REF, for VSSHV_REF from 0 V to VBAT-VGS, where VGSisa gate-source voltage of the first transistor.

14. A method of operating a current-sink buffer to sink transients in a load current, the method comprising:
providing a closed DC voltage loop operable to couple to an output a buffered output voltage ($V_{OUT}$) that tracks a reference voltage ($V_{SSHV\_REF}$) received on an input, wherein providing the closed DC voltage loop comprises providing:
a first transistor with a gate coupled to the input, and a source coupled to an input voltage ($V_{BAT}$) through a first current source;
a second transistor matched to the first transistor, where the second transistor is diode connected with a gate coupled to a drain and to the output, and a source coupled to the first current source and to the source of the first transistor;
a first current sink through which a drain of the first transistor is coupled to a ground; and
a second current sink through which the drain of the second transistor is coupled to ground;
providing a closed local current sink loop between the output and the ground, wherein providing the closed local current sink loop comprises providing the second current sink comprising a third transistor with a channel-type different from the first and second transistors, the third transistor having a source coupled to the ground, a drain coupled to the drain of the second transistor, and a gate coupled to the drain of the first transistor, and a capacitor coupled between the gate and drain of the third transistor; and
during a transient in the load current ($I_{LOAD}$), operating the closed local current sink loop to sink at least a portion of the $I_{LOAD}$ in a load coupled to the output to the ground.

* * * * *